United States Patent [19]
Bosse

[11] Patent Number: 5,740,185
[45] Date of Patent: Apr. 14, 1998

[54] INTERLEAVED DATA COMMUNICATIONS SYSTEM FOR CONTROLLING MULTIPLE CENTRIFUGES

[75] Inventor: Steven D. Bosse, Canton, Conn.

[73] Assignee: Sorvall Products, L.P., Newtown, Conn.

[21] Appl. No.: 730,546

[22] Filed: Oct. 11, 1996

[51] Int. Cl.$^6$ .................. H03M 13/00; G01N 33/48; G01N 35/00
[52] U.S. Cl. .................. 371/37.1; 371/30; 356/39; 356/40; 436/45
[58] Field of Search .................. 371/37.1, 30; 436/45, 436/63; 356/39, 40; 340/825.54

[56] References Cited

U.S. PATENT DOCUMENTS

| | | | |
|---|---|---|---|
| 4,837,160 | 6/1989 | Mesevol et al. | 436/45 |
| 4,873,633 | 10/1989 | Mezel et al. | 364/413.08 |
| 5,465,082 | 11/1995 | Chaco | 340/825.54 |
| 5,620,898 | 4/1997 | Yavemko et al. | 436/45 |

Primary Examiner—Reba I. Elmore
Assistant Examiner—Emmanuel L. Moise
Attorney, Agent, or Firm—Ohlandt, Greeley, Ruggiero & Perle

[57] ABSTRACT

A centrifuge network communication system for transmitting instructions to, and receiving data from, a plurality of centrifuge instruments using a central data controller. The central data controller transmits instructions to the centrifuge instruments in the form of discrete data packets, including (a) a centrifuge arbitration packet containing at least one command for a centrifuge instrument, (b) a command execution packet, commanding a centrifuge instrument that has previously received a centrifuge arbitration packet to execute the at least one command contained in the centrifuge arbitration packet, and (c) a transmit acknowledge packet commanding a centrifuge instrument that has previously received a command execution packet to transmit data generated in response to the centrifuge arbitration packet to the central data controller. Due to the interleaving of the data packets, a command execution packet transmitted to a first centrifuge instrument (n) further acts as a command arbitration packet for a second centrifuge instrument (n+1), and a transmit acknowledge packet transmitted to the first centrifuge instrument (n) further functions as a command execution packet for the second centrifuge instrument (n+1) and a centrifuge arbitration packet for a third centrifuge instrument (n+2).

27 Claims, 5 Drawing Sheets

INTERLEAVED DATA COMMUNICATIONS SYSTEM FOR CONTROLLING MULTIPLE CENTRIFUGES

The present invention is directed to a data communications system for use in controlling a plurality of centrifuge instruments, wherein the operating protocol to one centrifuge contains a portion of the operating protocol for the next two centrifuge devices. This interleaved data communications system of the present invention allows data packets to be used by more than one centrifuge, for different purposes, while maintaining transmission arbitration between the respective centrifuges.

BACKGROUND OF THE INVENTION

The input to the blood supply system in the United States is a network of blood bank centers which serve to collect, process and distribute human blood. Each center contains a plurality of centrifuge instruments which process this blood. A relatively large blood bank center has on the order of sixteen centrifuge instruments.

The centers are subject to regulation to maintain tight control over both the inventory of and quality of this blood supply. To achieve this level of control most blood banks use a bar coding system wherein a bar code label is affixed to the bag of donated blood at the time of donation. The blood bank can thereafter track the path of the blood bag as it works through the system while maintaining the confidentiality of the donor.

Food and Drug Administration's regulations (particularly, Standard for Good Manufacturing Practices (GMP)—Blood and Blood Components, Part 606.60 subpart D-Equipment) mandate that before blood bank production can begin each day a set of quality control (QC) protocols must be performed on each centrifuge instrument. The purpose of the QC protocols is to insure that each centrifuge instrument is able to perform properly each protocol that is anticipated being executed by that instrument during the upcoming production day. On a typical production day each instrument in the blood bank would be called upon to perform five or six different protocols.

To perform the QC protocols an operator must set the instrument for the appropriate speed and temperature of the protocol, start the instrument and permit it to run for several minutes before recording the final actual speed and temperature. This procedure must be repeated for each protocol. After the set of QC protocols is completed the results must be approved by a supervisor before a given centrifuge instrument can be operated in production. The daily production at a center may be delayed until the QC protocols are approved.

The presently mandated daily QC protocols and the anticipated documentation requirements for regular production runs are seen as being extremely labor intensive. Accordingly, in view of the foregoing, a system was developed to automate the performance of the presently mandated QC protocols and permit automatic documentation of regular production runs.

Each centrifuge instrument has a programmable controller therein. The programmable instrument controller is adapted to control the operation of the centrifuge instrument with which it is associated in accordance with a predetermined set of operational parameters. The set of operational parameters includes, for example, maximum rotational speed, temperature, time of centrifugation, acceleration to operational speed, deceleration from operational speed, relative centrifugal force (RCF) and the parameter $\omega^2 dt$.

2

The data communications system of the prior art comprised a central data controller and a communications link connecting the central data controller to each of the instrument controllers. The central controller had a memory therein. The communications link connected the central data controller to each of the instrument controllers in accordance with Electronic Industries Association (EIA) Standard 485. Each centrifuge instrument had a bar code reader associated therewith. The values read by the bar code reader were stored in a suitable memory provided in the instrument controller. In response to a command signal and its respective instrument address signal the instrument controller transmits the values of the bar codes as read by the bar code reader and stored by the instrument controller to the central data controller.

With this system, however, problems arise in the protocol for the transmission of data back from the centrifuges to the central data controller. Since only a single transmission line can be used to communicate data to the centrifuges from the central data controller, only one centrifuge could receive data at any given time; otherwise data would become corrupted.

Further, as the centrifuge system is an interrupt driven system, the communications load on the centrifuge needed to be minimized. Every time data is received by the centrifuge, an interrupt is generated; one byte of data interrupts for 1 ms. As a suitable data request could be as long as 86 bytes, the interruption could be quite lengthy and such a lengthy interruption could cause problems with the centrifuge's other sub-systems (e.g., speed control, temperature control). To resolve this problem, the data request was broken up into "packets", with each packet containing 26 bytes. Within this 26 byte packet, 4 bytes were allotted for error checking tokens or check sums. The problem with this protocol was that it took 62 mS to cycle through the three packets for each centrifuge. In large operations using 32 centrifuges, this amounts to almost 20 seconds to cycle through all the instruments. This is unacceptable from a user standpoint.

Thus, the conventional centrifuge communication systems are interrupt driven system and, as such, the communications load on the centrifuge needs to be minimized in order to substantially increase the overall speed of operation, particularly when large systems having 32 centrifuges are all reporting to a single central data controller. Moreover, all data needs to be error checked and the central data controller needs to receive updated data in short intervals.

The present inventor has overcome the aforementioned problems of the conventional one-to-one communication system wherein only one centrifuge can be transmitted to at a time over a single transmission line. It has been discovered that in order to reduce the load on the microprocessor, the amount of data received by each centrifuge needs to be reduced. For example, every time data is received by a centrifuge, an interrupt is generated, i.e., one byte of data interrupts for 1 ms. This compares to 86 bytes of data for each interrupt according to conventional controllers, wherein these lengthy interruptions cause problems with the centrifuge's other subsystems (e.g., speed control, temperature control, etc.).

To resolve the cycling time (i.e., approximately a 20 second cycle through all 32 instruments), the present inventor has developed the unique interleaved packet system of the present invention. Interleaving means to use the same single packet transmission on several different centrifuges, while still maintaining transmission arbitration to avoid data corruption. That is, the interleaved data communication system according to the present invention allows data packets to be used by more than one centrifuge, for different purposes, while maintaining transmission arbitration between the respective centrifuges. This system according to the present invention also includes an error checking system that virtually eliminates the use of corrupted data.

The present invention also provides many additional advantages which shall become apparent as described below.

SUMMARY OF THE INVENTION

The present invention is directed toward an interleaved data communications system for a plurality of centrifuge instruments in which the communications load on the centrifuges is minimized, all data can be checked for errors and updated data can be received in short intervals. This unique interleaved data communications system comprises a central data controller and a communication link connecting a central data controller (i.e., a microprocessor) to each of the instrument controllers, as well as an interleaved packet system, wherein each transmission data packet contains operating protocol which can be used by between about 1–3 centrifuges, while maintaining transmission arbitration to avoid data corruption.

In the invention, instructions are transmitted to the centrifuge instruments in the form of discrete data packets including a centrifuge arbitration packet containing commands for the centrifuge instruments, a command execution packet, commanding the centrifuge instrument that has previously received a centrifuge arbitration packet to execute the commands contained in the centrifuge arbitration packet, and a transmit acknowledge packet commanding a centrifuge that has previously received a command execution packet to transmit data generated by the centrifuge instrument in response to the centrifuge arbitration packet to the central data controller. Due to the interleaving of the data packets, a command execution packet transmitted to a first centrifuge instrument (n) also acts as a command arbitration packet for a second centrifuge instrument (n+1). The transmit acknowledge packet transmitted to the first centrifuge (n) also functions as a command execution packet for the second centrifuge (n+1), and as the centrifuge arbitration packet for a third centrifuge instrument (n+2). With this system, the data load on the centrifuge instruments, and the interrupt times are dramatically reduced and, as only one centrifuge can transmit each time a packet is sent, data corruption is not an issue. The invention is further directed to a storage medium for operating the system in the above-described manner, as well as the process itself.

Other and further objects, advantages and features of the present invention will be understood by reference to the following specification in conjunction with the annexed drawings, wherein like parts have been given like numbers.

DESCRIPTION OF THE PREFERRED EMBODIMENTS

Figure 1:
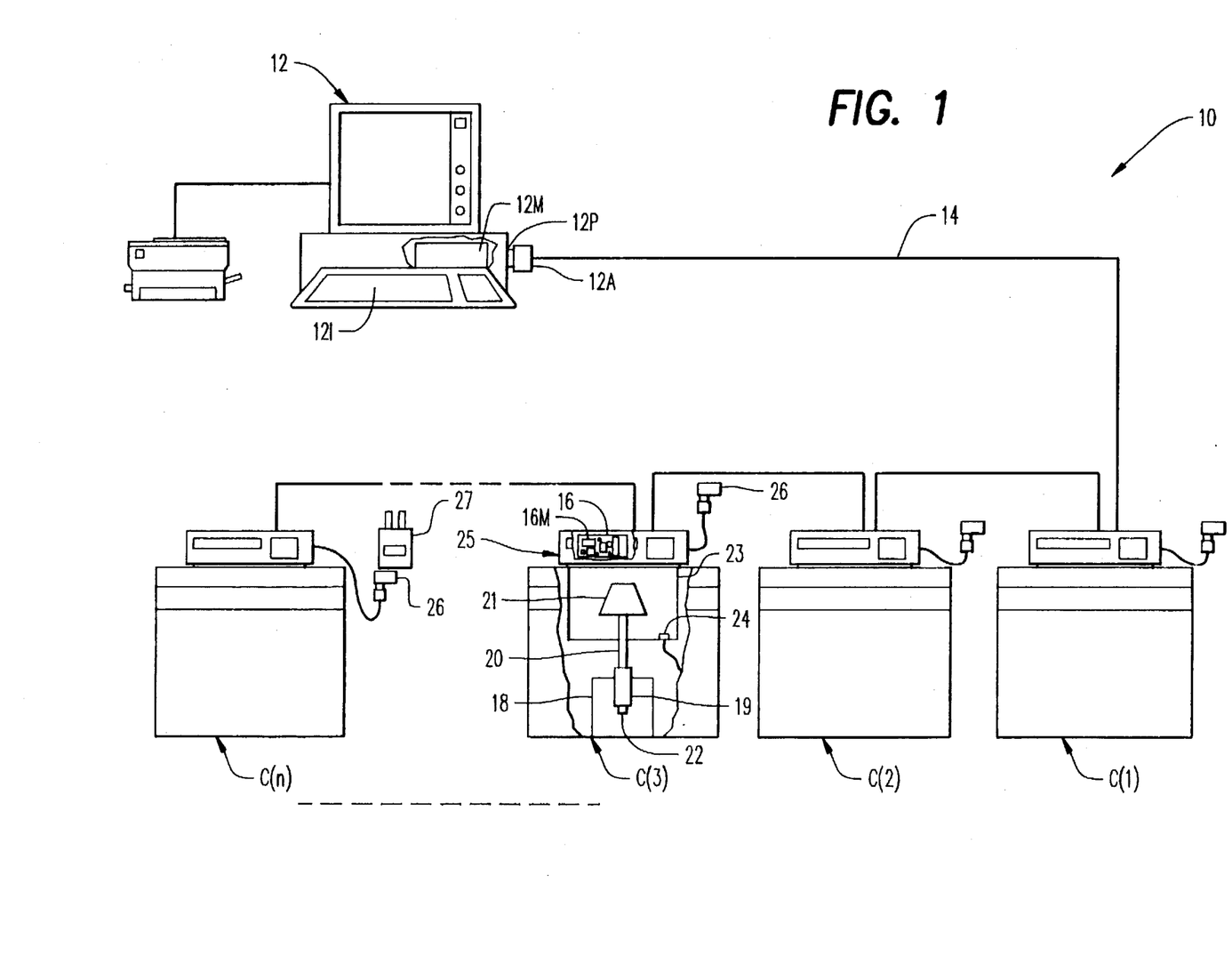
FIG. 1 is a schematic representation of the interleaved data communications between multiple centrifuge devices ($C_1$ to $C_n$) and a central microprocessor according to the present invention.

The present invention can best be understood by referring to the attached figures, wherein FIG. 1 illustrates a data communications system, generally indicated by reference character 10, in accordance with the present invention, as implemented in the environment of a relatively large blood bank center. Data communications system 10 includes central data controller 12 and communications link 14. Communications link 14 complies with Electronic Industries Standard for Electrical Characteristics of Generators and Receivers for Use in Balanced Digital Multipoint Systems, EIA-485 (April 1983). This standard is incorporated herein by reference.

A relatively large blood bank center will contain 'n' number of blood processing centrifuges denoted in FIG. 1 by the reference character C(1) through C(n). For any given blood bank center the number 'n' represents any convenient number of centrifuge instruments. Typically, the number 'n' is on the order of sixteen instruments, although the data communications system of the invention is presently able to accommodate thirty two centrifuge instruments. Centrifuge instruments C(1) through C(n) are shown as being linked to each other and to central data controller 12 via communications link 14.

Each processing centrifuge C(1) through C(n) has a framework 18 within which motor 19 is suspended. The motor 19 provides motive force to a shaft 20 that extends centrally and axially through framework 18. The shaft 20 is adapted to accept a blood processing rotor 21. The rotor 21 has a plurality of receptacles therein., each receptacle being adapted to receive a blood bag. Attached to the shaft 20, usually on the opposing end, is a tachometer device 22 that monitors the rotational speed of the shaft 20.

Within the framework 18 of each centrifuge instrument there is an open-topped chamber, or bowl 23, with a centrally located opening through which the shaft 20 of the motor extends. Surrounding the bowl 23 are refrigeration tubes that carry a gaseous refrigerant in a closed refrigeration loop including a condenser unit and a compressor unit. Both the condenser and compressor units are housed within the framework of the centrifuge instrument. Attached to and extending into the bowl 23 is a thermoelectric transducer 24 which usually takes the form of a thermocouple or a thermal sensing chip such as the Analog Devices AD590. The thermoelectric transducer 24 monitors the air temperature of the bowl 23.

A user panel 25 is located on each instrument which allows a clinician to set the various operational parameters required for a centrifugation run. Typically, the set of operational parameters includes maximum rotational speed of the rotor 21, temperature within the bowl 23, time of centrifugation, acceleration to operational speed, relative centrifugal force (KCF), and the parameter $\omega^2$ dt. Additionally, the user control panel 25 includes instrument "Start" and "Stop" buttons.

Each centrifuge instrument C includes a local instrument controller 16 which controls the operation of the centrifuge instrument. The instrument controller 16 is typically implemented using a microprocessor-based computer system operating under the control of a program. The instrument controller 16 includes a suitable memory 16 M therein. The local instrument controller 16 controls the operation of the centrifuge with which it is associated in accordance with the user-selected operational parameters input via the control panel 25. To this end the various transducers disposed within the instrument, such as the outputs from the thermoelectric transducer 24 and the tachometer device 22, are applied to, stored by, and used by the local instrument controller 16 to control instrument operation.

Each centrifuge instrument C also has a bar code reader 26 associated therewith. The bar code reader 26 is operative to read the bar code label 27 affixed to each bag of blood processed by each instrument. The bar code reader 26 is connected to the local instrument controller 16 so that bar code information may be stored in memory 16 M thereof.

At the heart of the communications system 10 in accordance with the present invention is the central data controller generally indicated by the reference character 12. The central data controller 12 is preferably implemented using an IBM-compatible personal computer, having a pentium or higher-class CPU running at a clock speed of 75 MHz with at least 8 MB of random access memory. The central data controller 12 is equipped with KS232 serial communications circuitry including a port 12P and an adapter 12A allowing the port 12P to connect with the communications link 14 operating under Electronic Industries Association (EIA) Standard 485. The central data controller 12 is connected to each centrifuge instrument C(1) through C(n) over the communications link 14. Each centrifuge instrument C(1) through C(n) connected to the data communications link 14 has a predetermined address associated therewith.

Central data controller 12 has a magnetic storage device or storage medium/media 12 M (e.g., a hard drive or a floppy disk) that allows long term storage of both its executing software as well as the data collected in the manner to be described over the communications link 14 from the centrifuge instruments C(1) to C(n). Central data controller 12 includes a suitable user interface 12I whereby commands and information may be exchanged between the user and central data controller 12, thereby allowing a clinician to input into the memory various commands and data for use in the controlling software. Central data controller 12 also has a display in the form of a monitor (e.g. CRT) for visual presentation of the results collected by the controlling software.

Central data controller 12, under the control of its program, is operative to accept input from a clinician (through interface 12I) and issue desired data packets to the data communications link. As will be discussed in more detail herein, the data packets are received by the local instrument controller 16 in each of the centrifuge instruments. Information is sent from local instrument controller 16 via communications link 14 to central data controller 12.

Figure 2:
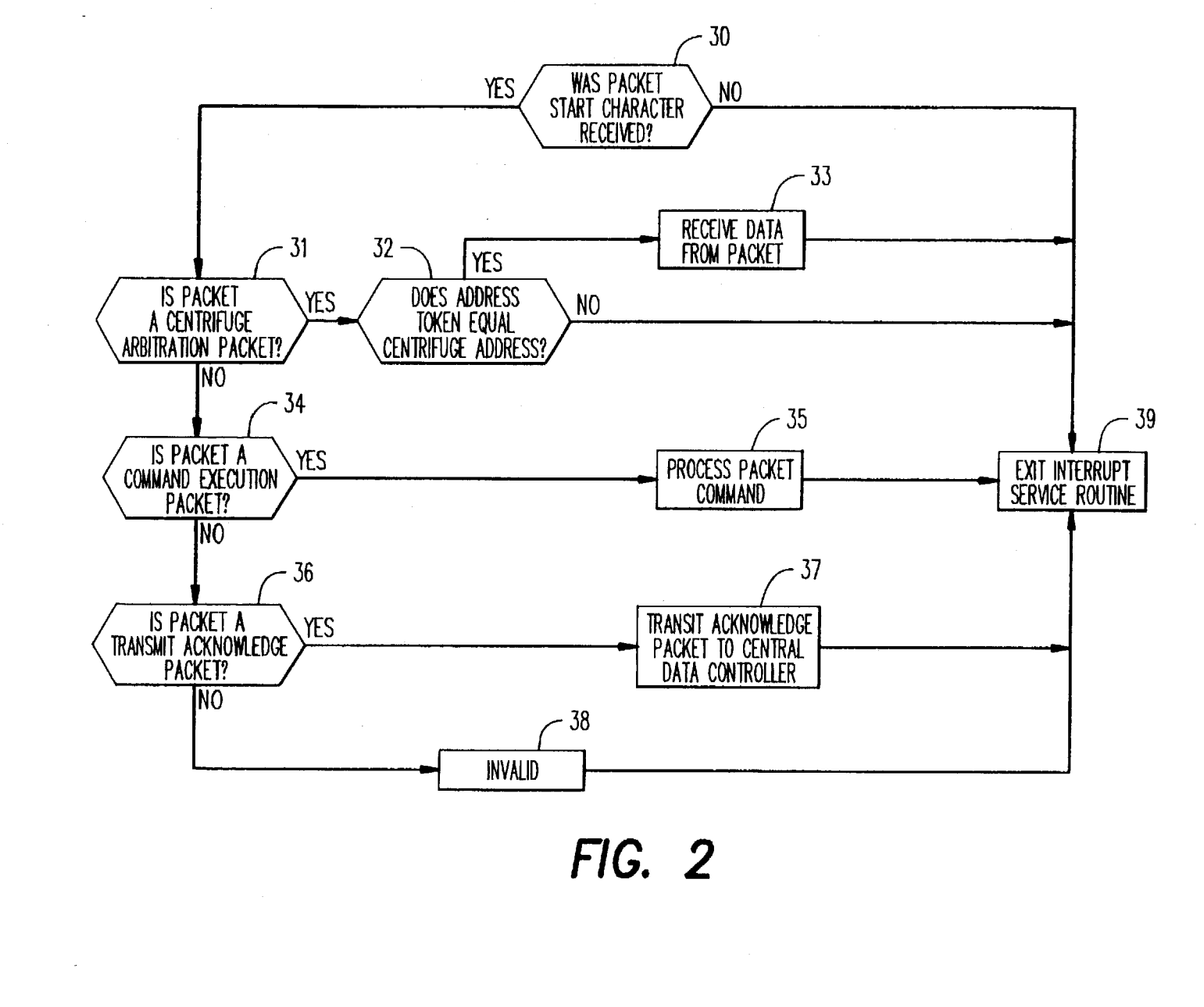
FIG. 2 is a high level flow logic diagram of the central data controller used to implement the interleaved data communications system of the present invention.

FIG. 2 provides a flow chart illustrating the reception of data by the centrifuge instruments C from the central data controller 12. When the centrifuge instrument C receives the first byte it determines whether a packet start token 30 is present. If no such token is detected, centrifuge instrument C ignores the packet and the centrifuge instrument C exits out of the interrupt service routine 39. If the packet has a proper packet start character, the centrifuge instrument determines whether the packet is a centrifuge arbitration packet 31. If it is, the centrifuge instrument C determines whether the data therein is addressed to the receiving centrifuge instrument C by checking the address token in the packet 32. If this address matches the centrifuge instruments permanent ID, the centrifuge instrument C receives and stores the data in the packet 33, and then exits out of the interrupt service routine 39.

If the packet is not a centrifuge arbitration packet, the centrifuge instrument C determines whether it is a command execution packet 34, and if it is, processes the packet command 35 and exits out of the interrupt service routine 39. If it is determined that the packet is not a command execution packet 36, the centrifuge instrument C determines whether it is a transit acknowledge packet. If it is, the centrifuge instrument C transmits a transmit acknowledge packet to the central data controller 37, and exits out of the interrupt service routine 39. If it is not, the packet must be invalid 38, in which case the data therein is ignored and the centrifuge instrument C exits to the interrupt service routine 39.

Figure 3:
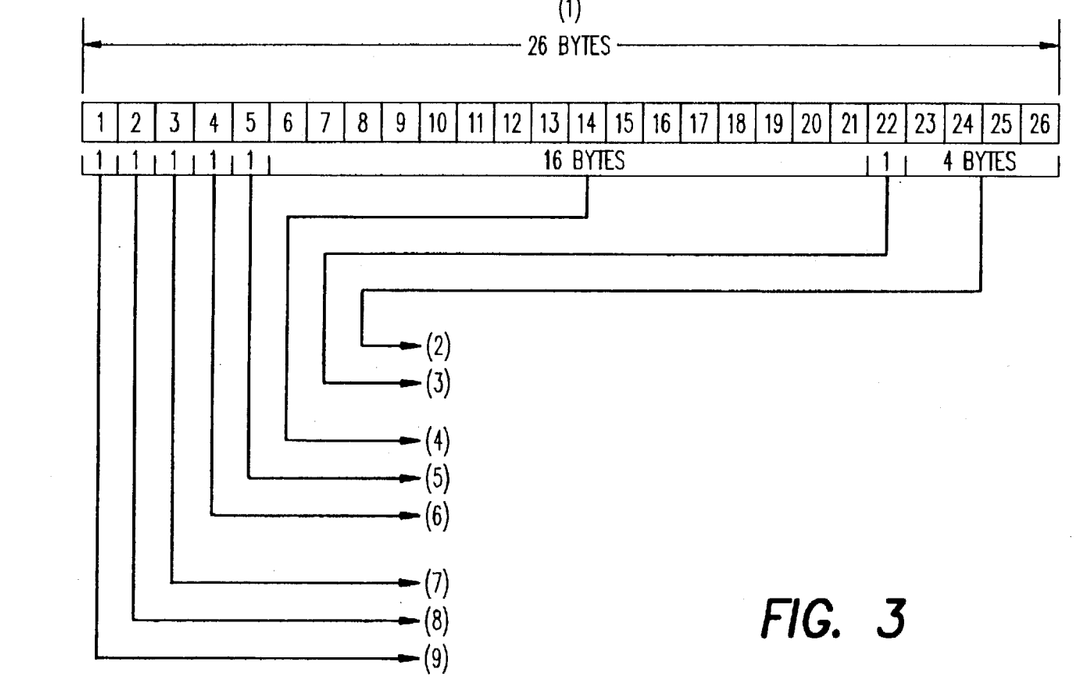
FIG. 3 illustrates the physical layout for each interleaved data packet used in accordance with the present invention.

As noted previously, with the present inventive, the 86 byte data request transmitted to the centrifuge instruments is broken up into "packets", with each packet containing 26 bytes, in order to reduce the load on the processor, and to avoid lengthy interrupts. The layout of one possible embodiment of the unique centrifuge communication packet protocol according to the present invention is shown in FIG. 3. As is shown in the FIG. 3, the preliminary packet size 1 is 26 bytes. Of this 26 bytes, 4 bytes are allotted for either data summation checksum, or 32-bit CRC tokens 2. One byte is provided for an extra protocol token 3 while 16 bytes are dedicated to the actual data transport tokens 4 which contain either transmit or receive data from the centrifuge. The remainder of the packet contains 1 byte for each of protocol packet interaction token 5 which is used as a packet ID for packet tracking during transmission and acknowledge cycles, protocol error token 6 used as a general error posting location for both the receiver and transmitter, centrifuge command token 7 used primarily as a function execution director to the centrifuge or as a means for the centrifuge to direct the central data controller, a centrifuge address token 8 used as a means of centrifuge arbitration with multi-centrifuge configurations and a packet start token 9 which operates as a packet start attention character with which the centrifuge synchronizes.

Figure 5:
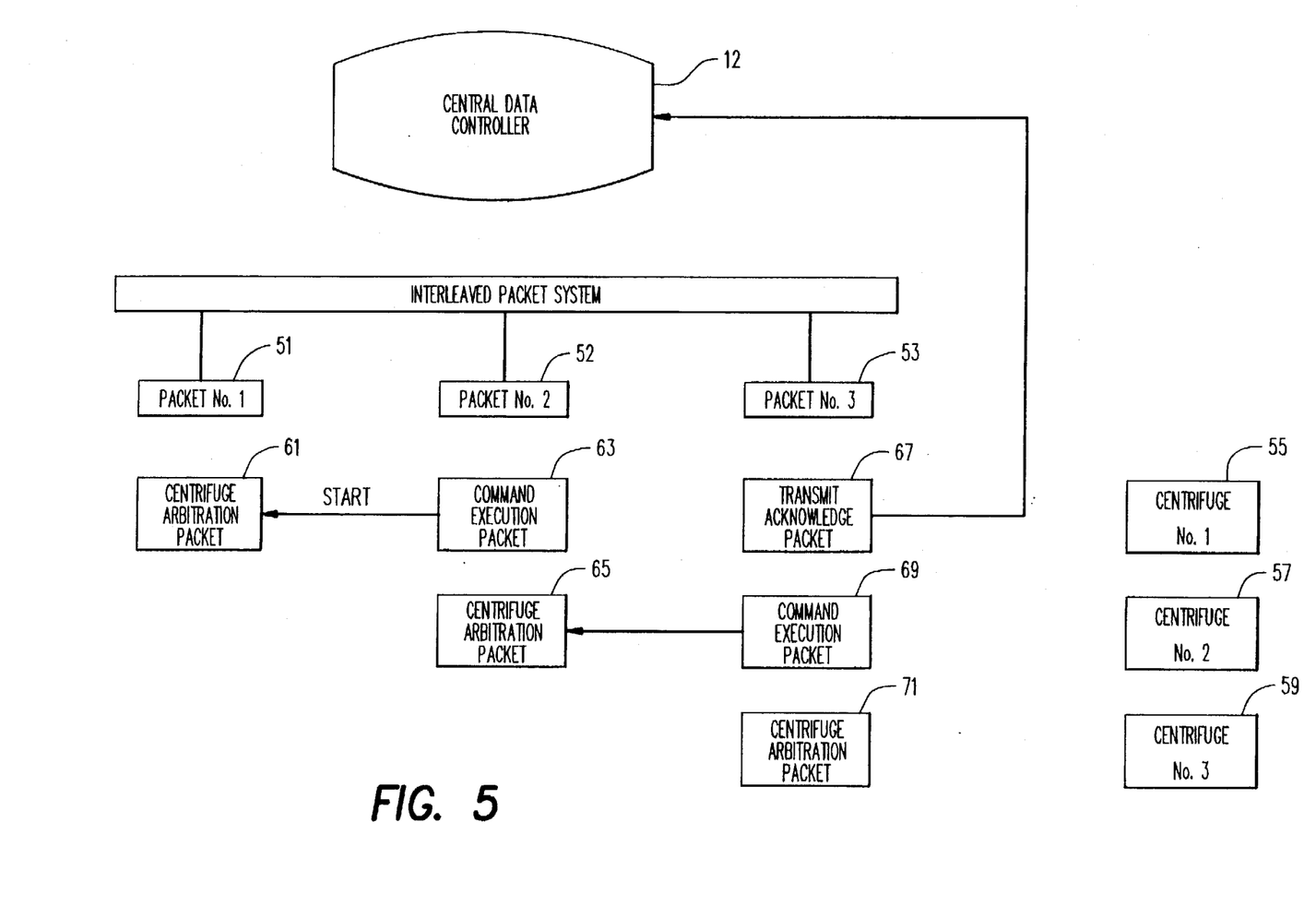
FIG. 5 is a block diagram depicting the interleaved data packet system wherein only the packets used to control Centrifuge No. 1 are shown, and wherein Packet No. 2 includes the centrifuge arbitration protocol for Centrifuge No. 2, and Packet No. 3 includes the command execution protocol for Centrifuge No. 2 and the centrifuge arbitration protocol for Centrifuge No. 3.

The present invention employs an interleaved packet system as shown in FIG. 5, wherein the data in each interleaved data packet (51, 52, or 53) enables it to transmit such data to several different centrifuge instruments (e.g., 55, 57 or 59) simultaneously, while maintaining transmission arbitration to avoid data corruption. For example, when a first selected centrifuge instrument 55 receives a transmission addressed to its unique address, it receives and stores all 26 bytes in this first packet 51, referred to as the centrifuge arbitration packet 61. Upon receiving second packet 52, which comprises command execution packet 63 and centrifuge arbitration packet 65, first centrifuge instrument 55 stores only the first byte, the packet start token 9, and ignores the rest as the remaining data and tokens pertaining to centrifuge arbitration packet 65 are addressed to second centrifuge 57. The sole purpose of command execution packet 52 for first centrifuge instrument 55 is to start or execute the command given in centrifuge arbitration packet 51. Thus, second packet 52 serves two purposes; it is command execution packet 63 for first centrifuge instrument 55 and centrifuge arbitration packet 65 for second centrifuge instrument 57. When first centrifuge instrument 55 receives third packet 53 which comprises transit acknowledge packet 67, command execution packet 69 and centrifuge arbitration packet 71, first centrifuge instrument 55 constructs its own packet of data, based on commands given in centrifuge arbitration packet 61, and transmits it back to central data controller 12. While third packet 53 is the transmit acknowledge packet 67 for first centrifuge instrument 55, it is also the command execute packet 69 for second centrifuge instrument 57 and the centrifuge arbitration packet 71 for third centrifuge instrument 59. As no centrifuge instrument will transmit until it has received its third packet 53, there will be no electrical contention issues in the transmission of data back to the central data controller 12.

Figure 4:
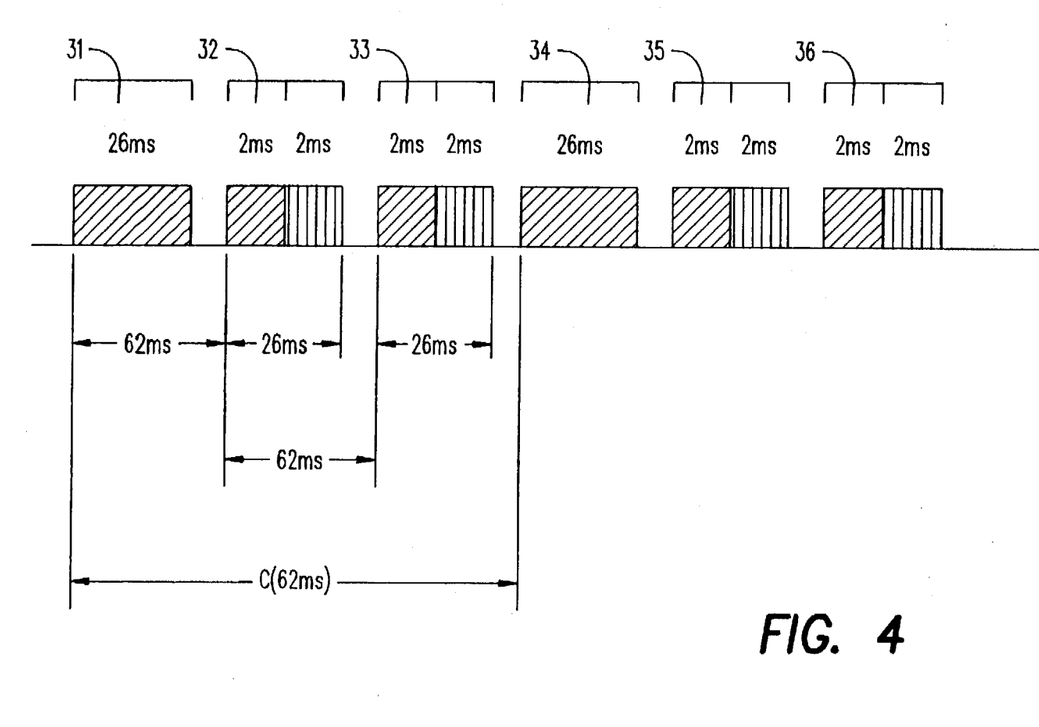
FIG. 4 represents the packet reception interleaved processing sequence for the centrifuge communication protocol of the communications system of the present invention.

FIG. 4 shows the interleaved packet reception and processing protocol for centrifuge communication. In a situation in which thirty two centrifuges are being used, an error free centrifuge arbitration packet 31 arrives containing a target centrifuge address for a first centrifuge instrument. This packet also serves as the command execution packet for the thirty second centrifuge instrument and the transmit acknowledge for the thirty first centrifuge instrument. An error free command execution packet 32 then arrives for the first centrifuge instrument. This packet also serves as the transmit acknowledge packet for the thirty second centrifuge instrument and the centrifuge arbitration packet 33 for the second centrifuge instrument. An error free transmit acknowledge packet then arrives for the first centrifuge instrument. This packet also acts as the command execution packet for the second centrifuge instrument and the centrifuge arbitration packet for the third centrifuge instrument. Error free centrifuge arbitration packet 34 arrives. It contains a target centrifuge address for the fourth centrifuge instrument. This packet also serves as the command execution packet for the third centrifuge instrument and the transmit acknowledge for the second centrifuge instrument. An error free command execution packet 35 arrives for the fourth centrifuge instrument. This packet also serves as the transmit acknowledge for the third centrifuge instrument and the centrifuge arbitration packet for the fifth centrifuge instrument. Error free transmit acknowledge packet 36 arrives for the fourth centrifuge instrument. This packet also serves as the command execution packet for the fifth centrifuge instrument and the centrifuge arbitration packet for the sixth centrifuge instrument.

Since each centrifuge instrument C must have its own unique ID, the inventive system was further configured to automatically determine how many centrifuge instruments are installed, and generate and assign permanent, unique ID's to each instrument. To do so, upon startup, the clinician initiates an auto-ID install function. The data controller, in response, broadcasts a special command which is received by all the centrifuge instruments C connected via communications link 14. The command causes each centrifuge instrument to generate a random number between 1 and 254. Each centrifuge instrument C assigns the selected number as its temporary ID. The central data controller issues packets with a second special command and listens for acknowledgments. If two centrifuge instruments choose the same random number, when acknowledgments are transmitted back, central data controller 12 will receive corrupted data. Central data controller 12 notes the corrupted node number and continues until reaching the final node.

Central data controller 12 then re-transmits the special command to any nodes from which corrupted data is received. The acknowledgment cycle is repeated. This is done until no corrupted data is received. Using a third special command the central data controller assigns permanent ID's to the connected centrifuge instruments. These permanent ID's are sequential from 1 to 32. The permanent ID of each centrifuge instrument is stored in the corresponding instrument controller.

The inventive system is further able to error check the packets. When a centrifuge instrument C receives the first byte it determines whether a packet start token 30 is present. If no such token is detected, centrifuge instrument 16 ignores the packet and the centrifuge instrument C exits to the interrupt service routine 39. When the centrifuge instrument C transmits back to central data controller 12, if any errors occurred, the centrifuge instrument C sets the protocol error token using 1 byte accordingly. Upon receiving this error token, central data controller 12 re-sends the centrifuge arbitration packet to this centrifuge instrument C.

The other error check used by both the centrifuge instrument C and central data controller 12 is performed using either a checksum and/or a cyclic redundancy check (CRC) on the packet. When the packet is constructed, the sender (either the centrifuge instrument or the central data controller) performs the checksum/CRC, and places this value in the last four bytes of the packet. When the receiver (either the central data controller or the centrifuge instrument) performs the checksum/CRC on the packet, if it does not equal the checksum/CRC in the packet, an error is generated and the data is ignored. When an error is detected, the packet sequence to this centrifuge instrument is re-sent.

While I have shown and described several embodiments in accordance with my invention, it is to be clearly understood that the same are susceptible to numerous changes apparent to one skilled in the art. Particularly, it is noted that while the above specification describes the invention in the context of a centrifuge system, it is equally applicable to any system in which a plurality of controllable instruments of any type are daisychained to a central data controller. Therefore, I do not wish to be limited to the details shown and described but intend to show all changes and modifications which come within the scope of the appended claims.

What is claimed is:

1. A communication system for transmitting instructions to, and receiving data from, a plurality of instruments using a central data controller, said system comprising:

means for transmitting instructions to said instruments in the form of discrete data packets, said packets comprising: (a) a first data packet which comprises a first arbitration packet containing at least one command for a first instrument; (b) a second data packet which comprises: (i) a first command execution packet which is capable of commanding said first instrument to execute the at least one command contained in said first arbitration packet; and (ii) a second arbitration packet, containing at least one command for a second instrument; and (c) a third data packet which comprises: (i) a first transmit acknowledge packet which is capable of commanding said first instrument to transmit data generated in response to said first arbitration packet to said central data controller; (ii) a second command execution packet which is capable of commanding said second instrument to execute the at least one command contained in said second arbitration packet; and (iii) a third arbitration packet containing at least one command for a third instrument; and a communications link connecting said plurality of instruments to said central data controller.

2. The system according to claim 1 further comprising a processor for each of said instrument which is capable of receiving said at least one command from said central data controller, executing said at least one command and transmitting said data generated in response, to said central data controller.

3. The system according to claim 1 further comprising means to assign a unique identity to each of said plurality of instruments.

4. The system according to claim 3 wherein said means to assign a unique identity comprises: (a) means to issue a first command to said plurality of instruments, instructing said instruments to each generate a random number and assign this number as a temporary identity; (b) means for issuing a second command instructing each of said instruments to transmit said temporary identity back to said central data controller; (c) means for receiving the transmission of said temporary identity from each of said instruments; and (d) means for assigning a sequential, permanent identity to each of said instruments that transmits a temporary identity.

5. The system according to claim 4 wherein said instruments comprise: (a) means for generating a random number and storing the generated random number as a temporary identity; (b) means for transmitting said temporary identity to said central data controller; and (c) means for receiving said permanent identity from said central data controller and replacing said temporary identity with said permanent identity.

6. The system according to claim 5 wherein said central data controller further comprises: (a) means for recognizing corrupted data corresponding to the selection of the same temporary identity by at least two instruments; and (b) means for determining which at least two instruments selected the same temporary identity, retransmitting said first command to said at least two instruments and repeating the identity cycle until no corrupted data is received.

7. The system according to claim 4 wherein each of said instruments comprises a means for comparing a first byte of said packets, wherein said first byte comprises an address with said permanent identity, and means for exiting if said permanent identity and said address do not match.

8. The system according to claim 1 wherein said instruments further comprise:
means for determining data errors and setting a protocol error token in a packet containing data generated in response to said transmit acknowledge packet when an error is detected, said central data controller further comprising means to identify said error token and re-send said arbitration packet to said instruments transmitting said error token.

9. The system according to claim 1 further comprising:
means for performing a first checksum/CRC on said packet received from said central data controller and placing this value within the data of said packet;
means for performing a second checksum/CRC on the packet received from one of said instruments;
means for comparing the first checksum/CRC to the second checksum/CRC;
means for generating an error code and rejecting the data when said first checksum/CRC does not match said second checksum/CRC; and
means for recognizing an error code generated by either said central data controller or one of said instruments and re-transmitting said packet to the other in response to said error code.

10. A process for transmitting instructions to, and receiving data from, a plurality of centrifuge instruments using a central data controller, said process comprising:
transmitting instructions from said central data controller to said instruments in the form of discrete data packets, said packets comprising: (a) a first data packet which comprises a first arbitration packet containing at least one command for a first instrument, (b) a second data packet which comprises: (i) a first command execution packet, which is capable of commanding said first instrument to execute the at least one command contained in the said first arbitration packet; and (ii) a second arbitration packet, containing at least one command for a second instrument, and (c) a third data packet which comprises (i) a first transmit acknowledge packet which is capable of commanding said first instrument to transmit data generated in response to said first arbitration packet to said central data controller; (ii) a second command execution packet which is capable of commanding said second instrument to execute the at least one command contained in said second arbitration packet; and (iii) a third arbitration packet containing at least one command for a third instrument.

11. The process according to claim 10 wherein each of said instruments receives said at least one command from said central data controller, executes said at least one command, and transmits said data generated in response, to said central data controller.

12. The process according to claim 10 further comprising assigning a unique identity to each of said plurality of instruments.

13. The process of claim 12 wherein, to assign a unique identity, (a) a first command is issued to said plurality of instruments, instructing said instruments to each generate a random number and assign this number as a temporary identity; (b) a second command is issued instructing each of said instruments to transmit said temporary identity back to said central data controller, (c) the transmission of said temporary identity from each of said instruments is received and a sequential, permanent identity is assigned to each of said instruments that transmits a temporary identity.

14. The process according to claim 13 wherein each of said instruments (a) generates a random number and stores the generated random number as a temporary identity; (b) transmits said temporary identity to said central data controller; (c) receives said permanent sequential identity from said central data controller; and (d) replaces said temporary identity with said permanent identity.

15. The process according to claim 14 wherein said central data controller further (a) recognizes corrupted data corresponding to the selection of the same temporary identity by at least two instruments; (b) determines which at least two instruments selected the same temporary identity; (c) re-transmits said first command to said at least two instruments; and (d) repeats the identity cycle until no corrupted data is received.

16. The process of claim 13 wherein each of said instruments compares a first byte of said packets, wherein said first byte comprises an address, with said permanent identity and exits if said permanent identity and said address do not match.

17. The process of claim 10 wherein said instruments further determines data errors and sets a protocol error token in a packet containing said data generated in response to said transmit acknowledge packet when an error is detected, and said central data controller further identifies said error token and re-sends said arbitration packet to said instruments transmitting said error token.

18. The process of claim 10 further comprises:

performing a first checksum/CRC on said packet received from said central data controller and placing this value within the data of the packet;

performing a second checksum/CKC on the packet received from one of said instruments;

comparing the first checksum/CRC to the second checksum/CKC;

generating an error code and rejecting the data when said first checksum/CRC does not match said second checksum/CKC; and recognizing an error code generated by either said central data controller or one of said instruments and re-transmitting the packet to the other in response to said error code.

19. A storage medium for controlling a central data controller so as to transmit instructions to, and receive data from, a plurality of instruments, over a communications link, said medium comprising:

means for transmitting instructions to said instruments in the form of discrete data packets, said packets comprising (a) a first data packet which comprises a first arbitration packet containing at least one command for a first instrument, (b) a second data packet which comprises: (i) a first command execution packet, which is capable of commanding said first instruments to execute the at least one command contained in said first arbitration packet; and (ii) a second arbitration packet, containing at least one command for a second instrument, and (c) a third data packet which comprises: (i) a first transmit acknowledge packet which is capable of commanding said first instrument to transmit data generated in response to said first centrifuge arbitration packet to said central data controller; (ii) a second command execution packet which is capable of commanding said second instrument to execute the at least one command contained in said second arbitration packet; and (iii) a third arbitration packet containing at least one command for a third instrument.

20. The storage medium according to claim 19 further comprising means for each of said instruments to receive said at least one command from said central data controller, execute said at least one command, and transmit said data generated in response to said central data controller.

21. The storage medium according to claim 19 further comprising means to assign a unique identity to each of said plurality of instruments.

22. The storage medium according to claim 21 wherein said means to assign a unique identity comprises; (a) means to issue a first command to said plurality of instruments, instructing said instruments to each generate a random number and assign this number as a temporary identity; (b) means for issuing a second command instructing each of said instruments to transmit said temporary identity back to said central data controller; (c) means for receiving the transmission of said temporary identity from each of said instruments and (d) means for assigning a sequential, permanent identity to each of said instruments that transmits a temporary identity.

23. The storage medium according to claim 22 wherein said instruments further comprise: (a) means for generating a random number and storing the generated random number as a temporary identity; (b) means for transmitting said temporary identity to said central data controller and (c) means for receiving said permanent identity from said central data controller, and replacing said temporary identity with said permanent identity.

24. The storage medium according to claim 23 wherein said central data controller further comprises: (a) means for recognizing corrupted data corresponding to the selection of the same temporary identity by at least two instruments; and (b) means for determining which at least two instruments selected the same temporary identity, re-transmitting said first command to said at least two instruments and repeating the identity cycle until no corrupted data is received.

25. The storage medium according to claim 22, wherein each of said instruments comprises means for comparing a first byte of said packets, wherein said first byte comprises an address, with said permanent identity and means for exiting if said permanent identity and said address do not match.

26. The storage medium according to claim 19 wherein said instruments further comprise:

means for determining data errors and setting a protocol error token in a packet containing said data generated in response to said transmit acknowledge packet when an error is detected, said central data controller further comprising means to identify said error token and re-send said arbitration packet to said instruments transmitting said error token.

27. The storage medium according to claim 19 comprising:

means for performing a first checksum/CRC on said packet received from said central data controller and placing this value within the data of the packet;

means for performing a second checksum/CRC on the packet received from one of said instruments:

means for comparing the first checksum/CRC to the second checksum/CRC;

means for generating an error code and rejecting the data when said first checksum/CRC does not match said second checksum/CRC; and means for recognizing an error code generated by either said central data controller or one of said instruments and re-transmitting the packet to the other in response to said error code.

* * * * *